US012772419B2

(12) United States Patent
Messick et al.

(10) Patent No.: US 12,772,419 B2
(45) Date of Patent: Oct. 20, 2026

(54) COMPUTER SYSTEM COOLING USING VENTILATION CHANNEL DEVICE

(71) Applicant: Dell Products L.P., Round Rock, TX (US)

(72) Inventors: Douglas E. Messick, Austin, TX (US); Rachel Mazzini, Dallas, TX (US); Patrick V. Illingworth, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 211 days.

(21) Appl. No.: 18/645,500

(22) Filed: Apr. 25, 2024

(65) Prior Publication Data

US 2025/0338451 A1 Oct. 30, 2025

(51) Int. Cl.

*H05K 7/20* (2006.01)
*H05K 7/14* (2006.01)

(52) U.S. Cl.

CPC ....... *H05K 7/20736* (2013.01); *H05K 7/1491* (2013.01); *H05K 7/1492* (2013.01); *H05K 7/20145* (2013.01)

(58) Field of Classification Search

CPC ............. H05K 7/20009; H05K 7/1487; H05K 7/1489; H05K 7/1491; H05K 7/1492; H05K 7/20; H05K 7/20145; H05K 7/20172; H05K 7/2019; H05K 7/202; H05K 7/209; H05K 7/20563; H05K 7/20572; H05K 7/20718; H05K 7/20727; H05K 7/20736; H05K 7/20754; H05K 7/20763; H05K 7/20772; H05K 7/20781; H05K 7/20809; H05K 7/20818; H05K 7/20836; H05K 1/0203; G06F 1/20

See application file for complete search history.

(56) References Cited

U.S. PATENT DOCUMENTS

| | | | | |
|---|---|---|---|---|
| 6,011,689 | A * | 1/2000 | Wrycraft | G06F 1/20 361/679.48 |
| 11,303,106 | B1 * | 4/2022 | Shearman | H05K 7/1454 |
| 11,703,924 | B2 | 7/2023 | Ahmed et al. | |
| 2002/0054479 | A1 * | 5/2002 | Wu | H05K 7/20727 361/695 |
| 2002/0134531 | A1 * | 9/2002 | Yanagida | G06F 1/20 165/80.3 |
| 2008/0218949 | A1 * | 9/2008 | Hughes | G11B 33/125 |
| 2016/0077556 | A1 * | 3/2016 | Gong | B21C 23/02 361/679.32 |

(Continued)

OTHER PUBLICATIONS

Glenn Charest, et al., "Open Rack V3 Base Specification," Open Compute Project, Revision 1.0, Aug. 24, 2022, pp. 1-27.

*Primary Examiner* — Amir A Jalali
(74) *Attorney, Agent, or Firm* — Fogarty LLP

(57) ABSTRACT

A ventilation channel device may be used to provide cooling to components of a computing device. A ventilation channel device may be U-shaped and may be installed within a volume that is physically between fans. The bottom of the U-shaped may include air inlets, and those air inlets may lead to air outlets that are disposed near air intakes of the fans. The U-shape may be hollow from the inlets to the outlets, thereby allowing airflow from the inlets to the outlets. As a result, the air volume, located between the fans, may be moved by flowing through the ventilation channel device.

19 Claims, 9 Drawing Sheets

(56) References Cited

U.S. PATENT DOCUMENTS

| | | | | |
|---|---|---|---|---|
| 2019/0124785 | A1* | 4/2019 | Ehlen | H05K 7/1491 |
| 2020/0015386 | A1* | 1/2020 | Gupta | H05K 7/1401 |
| 2021/0400841 | A1* | 12/2021 | Okumura | H05K 7/20727 |
| 2022/0361362 | A1* | 11/2022 | Chen | G06F 1/20 |
| 2023/0108011 | A1* | 4/2023 | Cramer | G06F 1/183<br>455/90.3 |

* cited by examiner

COMPUTER SYSTEM COOLING USING VENTILATION CHANNEL DEVICE

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such computing racks that are organized into rows of racks. Administration of such large groups of IHSs may require teams of remote and local administrators working in shifts in order to support around-the-clock availability of the data center operations while minimizing any downtime.

As IHS hardware components, such as processors and memory, have increased in speed and power consumption, the amount of heat produced by such components during operation of an IHS has also increased. Often, the temperatures of IHS hardware components must be kept within a well-defined range in order to prevent overheating, instability, malfunction, and/or damage that would lead to a shortened component lifespan and lowered datacenter reliability. Accordingly, cooling systems are used in IHSs in order to remove heat that is generated by hardware components. In passive airflow cooling systems, cooling fans are used to force heated air away from a hardware component and to ventilate heated air away from cooling fins or other heat dissipating structures of the component. In an active, liquid cooling system, a heat-exchanging cold plate is thermally coupled to an IHS component that is to be cooled, and a chilled fluid is passed through conduits internal to the cold plate in order to remove heat from that component. The heated liquid is then cooled and recirculated.

SUMMARY

In some embodiments, a system includes: a chassis, wherein the chassis has a first dimension, along which the chassis is configured for insertion in a computing rack, wherein the chassis has a first side and a second side perpendicular to the first dimension, the chassis including: an air mover configured to create airflow in a direction along the first dimension, wherein the air mover is disposed in the chassis along the second side, further wherein the air mover has an exhaust disposed proximate the second side and an intake disposed along the first dimension at a first length from the second side; a power connector, disposed at the second side of the chassis and extending away from the second side of the chassis along the first dimension; and a ventilation channel device having an inlet disposed between the first length and the second side and having an outlet disposed between the intake and the first side.

In some embodiments, a method includes: generating heat in a chassis that is plugged into a busbar of a computing rack; operating a set of air movers to create airflow from a front of the chassis to a back of the chassis, wherein the back of the chassis includes a power connector that is plugged into the busbar, further wherein the set of air movers are located at a back side of the chassis; and channeling air from a volume within the chassis, wherein the volume is located between a first air mover of the set of air movers and a second air mover of the set of air movers, including moving the air from the volume to intakes of the set of air movers, further wherein the volume is located between the intakes of the set of air movers and the back of the chassis.

In some embodiments, an information handling system (IHS) includes: a first air mover and a second air mover disposed at a first side of the IHS; a power connector, disposed at the first side of the IHS and between the first air mover and the second air mover, further wherein the first air mover, the second air mover, and the power connector partially define a volume within the IHS; a U-shaped ventilation channel device having a first air inlet and a second air inlet proximate the power connector, a first air outlet proximate a first intake of the first air mover, and a second air outlet proximate a second air intake of the second air mover.

BRIEF DESCRIPTION OF THE DRAWINGS

Reference will now be made to the accompanying drawings, which are not necessarily drawn to scale, and wherein.

DETAILED DESCRIPTION

Figure 1:
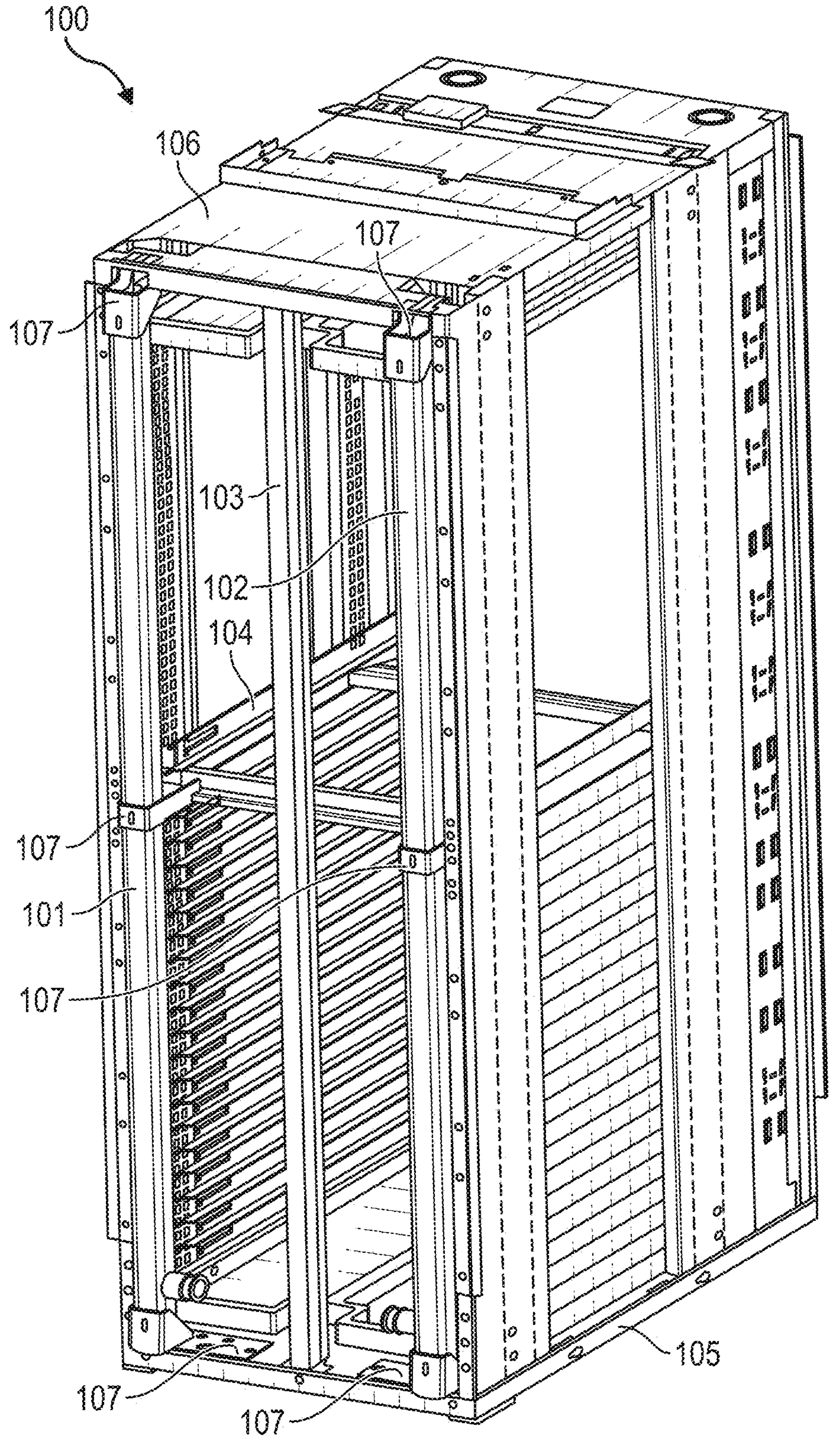
FIG. 1 shows a computing rack that includes liquid cooling manifolds and a busbar, and the computing rack is configured to accommodate an enclosure, according to various embodiments.

Technology now will be described more fully hereinafter with reference to the accompanying drawings. This technology may, however, be embodied in many different forms and should not be construed as limited to the embodiments set forth herein. Rather, these embodiments are provided so that this disclosure will be thorough and complete, and will fully convey the technology to those skilled in the art. One skilled in the art may be able to use the various embodiments of the technology.

The embodiments disclosed herein provide systems and methods for cooling a computing system using a ventilation channel device. In one example, a chassis includes an enclosure that is configured for insertion into a computing rack, and the chassis may include multiple components that may generate heat. Continuing with the example, the chassis may include a server IHS, and it may be configured for blind insertion into a computing rack and may include a power connector for mechanical and electrical coupling to a busbar in the computing rack.

The chassis may also include an air mover that is configured to create airflow in a direction along a first dimension, where the first dimension defines the direction of insertion of the chassis into the computing rack. In some examples, the side of the chassis closest to the busbar may be referred to as a back side, and the side of the chassis furthest from the busbar may be referred to as a front side. The power connector may be disposed at the back side, and may extend outward from the back side, and the air mover may also be disposed inside the chassis and at the back side of the chassis. Further in the example, power cables may extend from the power connector to various power components within the chassis, where the power components are placed between the air mover and the front side.

Such an arrangement of an air mover and a power connector at a back side of the chassis may create challenges. For instance, a volume located between air moving devices and in back of air mover intakes may experience stagnant air. The stagnant air may correspond to increased heating.

Systems and methods described herein may provide air movement for a volume that would otherwise have stagnant air. Specifically, various systems and methods use a ventilation channel device having an inlet disposed proximate the back side of the chassis and having hollow air channels that place outlets at air mover intake areas. For instance, the ventilation channel device may conform to a U shape, where the bottom of the U shape has inlets and is proximate the back side of the chassis, and the top of the U shape has air outlets extending laterally and into a low-pressure area created by air mover intakes.

In use, such example embodiments may draw air from a volume that is located closer to the back side of the chassis and move that air toward the front of the chassis, where that air may be exposed to air mover intakes.

Various embodiments may provide advantages over prior solutions. For instance, the ventilation channel device may prevent air from becoming stagnant near the power connector and power cables coupled to the power connector. Further, the ventilation channel device may move the air, thereby creating a cooling effect for the power connector and power cables as well as for the busbar. Cooling the power connector, power cables, and busbar may result in less thermal wear on the components of the computing system, and therefore may provide greater reliability and longer life for such components.

In a further embodiment, a heatsink is provided for the set of power cables that couple to the power connector. In one example, the heatsink may conform to a shape that surrounds the set of power cables and exposes fins on top to take advantage of airflow in the chassis. For instance, the heatsink may include a top portion and a bottom portion within a housing, where the housing includes a hinge to provide clamshell-like opening and closing. The top and bottom portion may be closed over the set of power cables so that the fins, which are part of the top portion of the heatsink, may be exposed above the set of power cables. As air flows through the chassis, the heatsink may provide heat removal from the set of power cables. The heatsink may be used with the ventilation channel device or without the ventilation channel device. As noted above, cooling the power cables may result in less thermal wear on the components of the computing system and therefore may provide greater reliability and longer life for such components.

FIG. 1 is an illustration of a computing rack 100, according to various embodiments. As explained further below, the example computing rack of FIG. 1 may be configured to house multiple chassis, such as compute chassis, storage chassis, and the like. A chassis may be configured for cooling using a ventilation channel device, where examples of ventilation channel devices are described in more detail below with respect to FIGS. 4-7.

Computing rack 100 may conform to any appropriate standard or proprietary design and, in particular, may conform to ORv3. FIG. 1 is a rear-facing view of a partially assembled computing rack 100. In some instances, rack 100 includes a frame structure, that may include side panels with rails, brackets, guides, or other components for receiving hardware that is installed in one or more slots 104 of the rack 100. Such hardware may include, for example, a chassis housing one or more of a server, processing unit, memory/storage device, cooling unit, or the like combined to form an Information Handling System (IHS). The frame structure of rack 100 may include a base 105 and a top cover 106 that may be connected via any number of vertical panels, braces, posts, supports, etc.

In the rear-facing view of FIG. 1, the length of busbar 103 is visible as it extends the vertical height of the rack 100, from the base 105 to the top cover 106 in providing a shared supply of power for the hardware components that are installed in the rack 100. Also visible in FIG. 1 is the full length of the liquid cooling manifolds 101, 102 that also extend the vertical height of the rack 100. In the illustrated embodiment, each of the liquid cooling manifolds 101, 102 are attached to the rack 100 via brackets 107. Through the fastening of brackets 107, each of the liquid cooling manifolds 101, 102 is firmly fixed to rack 100. The couplings (not shown) of the liquid cooling manifolds 101, 102 are aligned with rack, and thus with liquid cooling couplings of a chassis or server when installed in a slot of the rack 100. Aligned in this manner, an administrator is able to insert a chassis into the rack 100 and apply force on the chassis until liquid cooling couplings of the chassis are connected with corresponding couplings of the liquid cooling manifolds 101, 102. Similarly, busbar 103 extends the height of computing rack 100 and provides power to each chassis, server, or other IHS component installed in slots on rack 100.

Figure 2:
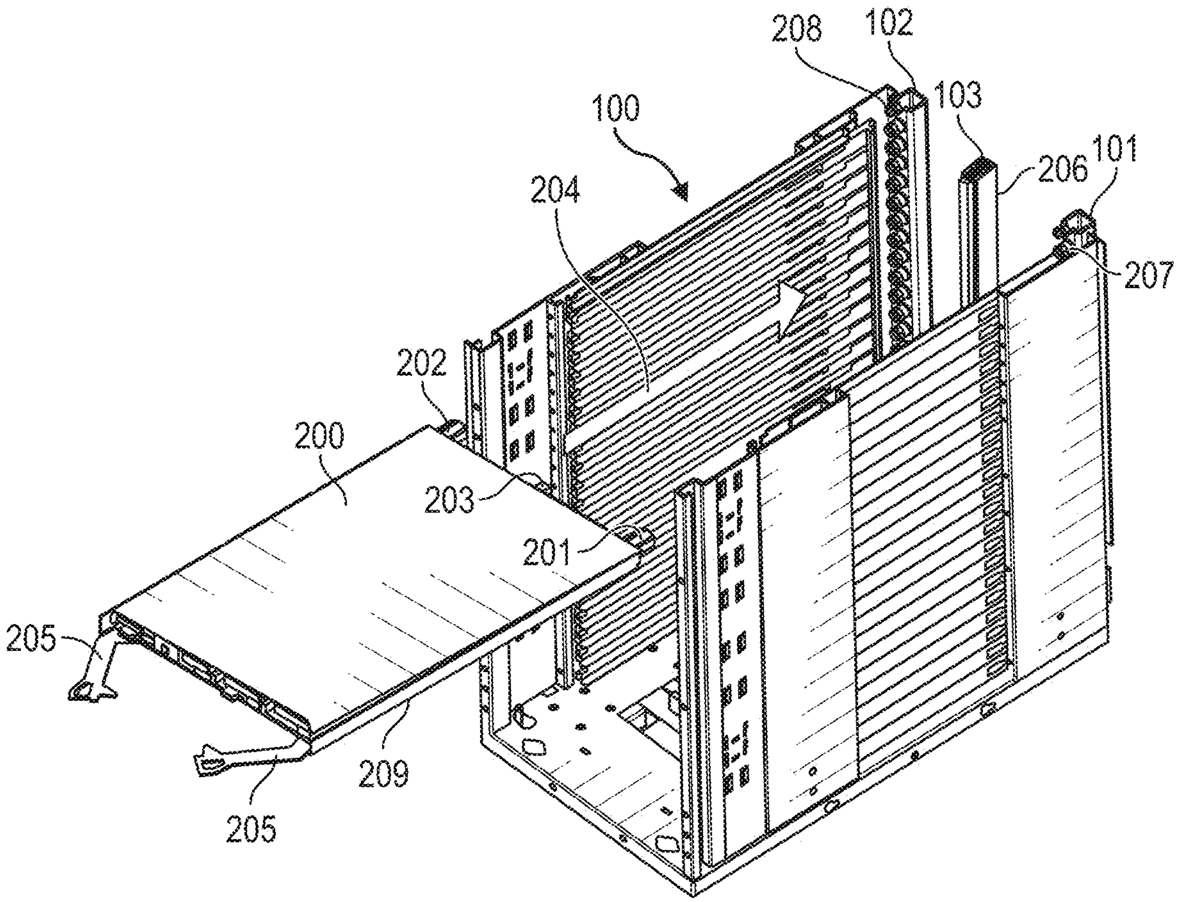
FIG. 2 is an illustration of a server IHS being inserted into a slot of the computing rack shown in FIG. 1.

FIG. 2 is an illustration of a server IHS 200 being inserted into a slot of computing rack 100. The server 200 may share resources provided by the rack 100, such as shared cooling and power. Accordingly, insertion of server IHS 200 into a slot of rack 100 couples the liquid cooling couplings 201, 202 on server IHS 200 to liquid cooling manifolds 101, 102, respectively. Power connector 203 on server IHS 200 is coupled to busbar 103. In a data center environment, server IHS 200 may be installed within a rack 101 along with other similar chassis, such as other server IHSs, that are likewise installed in one or more slots where some or all of these chassis may be similarly coupled to liquid cooling manifolds 101, 102 and busbar 103 provided by the rack 101. Rack 101 includes multiple slots in which a server IHS 200 or similar chassis can be physically inserted by an administrator, where the server IHS 200 is inserted by force applied by an administrator in the direction 204 illustrated in FIG. 2. The sever IHS 200 may be securely locked in place the rack 100 by closing latches 205, which engage with the front edge of rack 100.

When installing server IHS 200 within rack 100, the force applied in direction 204 by the administrator couples the server 200 to shared infrastructure resources of the rack 100. For instance, the server IHS 200 is securely coupled to busbar 103, which provides the server 200 with a supply of power. The busbar 103 provides a shared power supply used by some or all of the hardware installed in rack 100. Busbar 103 is partially enclosed within shielding 206, which prevents administrators or other users from touching the back or sides of busbar 103 to reduce risk of electrical shock.

In addition, the force applied by the administrator in direction 204 couples the server IHS 200 to liquid cooling manifolds 101, 102 provided by the rack 100. An inlet coolant manifold distributes cooled liquid from a recirculation system (not shown) to server IHS 200, and an outlet coolant manifold receives heated liquid from server IHS 200, which is returned to the recirculation system to be cooled. In the illustrated embodiments, the liquid cooling manifolds 101, 102 may be arranged with either of the manifolds functioning as the inlet manifold and the other as the outlet manifold, with this arrangement selected to correspond to arrangement of liquid cooling couplings 201, 202 of the server IHS 200 and of the other server IHSs or other hardware using the shared liquid cooling resources supported by rack 100. The use of liquid cooling manifolds 101, 102 enables the cooling of multiple servers and/or other hardware by a single cooling source (e.g., the liquid recirculation system).

Through the force applied by the administrator in direction 204, liquid cooling couplings 201, 202 of the server IHS 200 are connected to corresponding couplings 207, 208 of each of the liquid cooling manifolds 101, 102. Once coupled, the liquid cooling couplings 201, 202 are connected to internal inlet and outlet liquid coolant lines in the server IHS 200. In some embodiments, the liquid cooling couplings 201, 202 of the server IHS 200 and the couplings 207, 208 of the liquid cooling manifolds 101, 102 may be quick-connect couplings that can be connected without use of tools and solely via the force applied by the administrator in direction 204 (e.g., the Z-axis direction of FIG. 4). Through the use of such quick-connect couplings, the coupling of server IHS 200 to the liquid cooling manifolds 101, 102 may thus be completed blindly by the administrator that is inserting the server into a slot in the rack 100, while unable to view the liquid cooling couplings 201, 202 that are being connected.

In some instances, racks 100 are constructed according to standardized dimensions that define the vertical and horizontal dimensions of hardware components, such as one or more server IHSs 200, that can be installed within such racks. Standardized rack dimensions specify vertical units of space within a rack, where such vertical units of rack space may be referred to as RUs (Rack Units). In some instances, a server IHS 200 may be one rack unit (1RU) in height and may house a single IHS. In other instances, an individual sever IHS installed in a rack 100 may be multiple rack units in height and may include multiple IHSs. The chassis may conform to an integer number of rack units, such as 1 OU or RU, 2 OU or RU, or the like. The IHS 200 may be any appropriate size configured to fit within the rack 100. For example, a 2RU chassis may include a pair of front-facing bays that are each 1RU in height. In such a chassis, each of the bays may receive a 1RU IHS that may be separately administered and may be a replaceable component that may be coupled and de-coupled from a chassis. In such instance, the 2RU chassis may be coupled to liquid cooling manifolds 101, 102 of rack 100 and may provide cooling for the 1RU IHSs that are installed in the chassis.

Server IHS 200 and other hardware may be installed within one or more slots that are supported by the rack 100, where use of multiple slots may correspond to the server being multiple RUs in height. Through insertion in slots supported by the rack 100, server IHS 200 may be reliably located relative to the rack itself, at least with respect to vertical and horizontal positioning of the server relative to the rack. Such positioning of the server IHS 200 may be supported by various guides and/or other structures that are located along the sides 209 of the outer enclosure of the server. These guides along the sides 209 of the server are received by corresponding rails or other precisely positioned structures along the inner walls of the rack 100.

Figure 3:
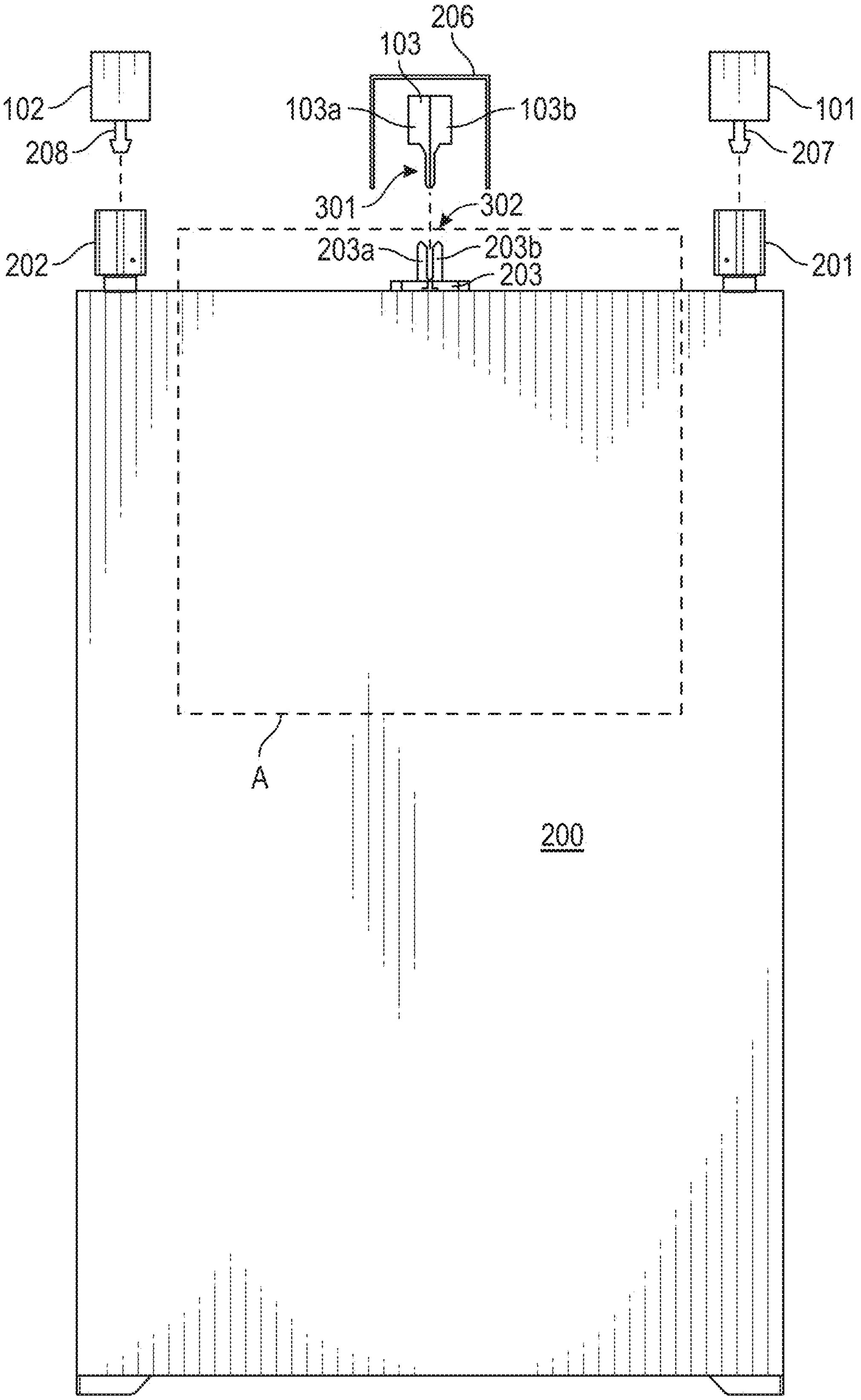
FIG. 3 is a top view of a server IHS making power and cooling connections while being installed into the computing rack shown in FIG. 1.

FIG. 3 is a top view of a server IHS 200 making power and cooling connections while being installed in a rack 100. Cooling manifolds 101, 102 extend vertically along the back side of rack 100. Liquid cooling couplings 201, 202 on server IHS 200 are configured to connect to cooling manifolds 101, 102 via male connectors 207, 208. Although not shown in FIG. 3, it is understood that each of the cooling manifolds 101, 102 may include a set of male connectors 207, 208 for any given rack unit along the height of the rack 100. Furthermore, the particular connectors 201, 202, 207. 208 are for example only, and the scope of implementations may be adapted to use any appropriate liquid cooling connector. In various implementations, the manifold cooling connectors 207, 208 and the server IHS cooling connectors 201, 202 may be either male or female.

Busbar 103 also extends vertically along the back side of rack 100. Busbar 103 is divided horizontally into two electrically isolated halves **103*a*, 103*b* that are assigned respective positive and negative, or high-low voltage, polarities for electrical power provided to server IHS 200. Computing racks complying with ORv3 use a DC busbar for power delivery. The typical busbar voltage is 48-54 Vdc and the busbar current can be as high as 3000 A to support 140 kW racks. Power connector 203 has two sides 203*a*, 203*b* corresponding to the polarity of busbar 103. A protrusion or ridge 301 runs vertically along busbar 103 and is configured to fit snuggly between prongs 203*a*, 203*b* of power connector 203** to ensure a tight electrical connection.

The current-carrying capacity of busbar 130 may be determined by the maximum temperature at which the bar is permitted to operate, which is typically defined as a maximum temperature rise in standards such as ANSI C37.20 for switchgear assemblies including metal-enclosed bus. As the operating temperature increases, the rate of surface oxidation of the conductor material increases rapidly, which limits the lifetime of the busbar. Accordingly, if the busbar can be cooled, then the busbar may be able to carry more current or safety margins for the busbar can be increased. Cooling busbar 103 may increase the thermal safety margin for rack 100, increase the current-carrying capacity of busbar 103, increase contact reliability with server IHS 200, and will decrease power loss. Convection cooling can be used to transfer heat away from busbar 103. Air cooling of busbar 103 is difficult in environments such as computing rack 100 where server IHS 200 are liquid cooled. Such computing racks require minimal air cooling so that the available airflow through the rack 100 is reduced compared to air-cooled racks. Additionally, protective shielding 206 blocks or reduces airflow near busbar 103 even if the shielding 206 is formed from a perforated or screen material. Liquid cooling of busbars is difficult to achieve due to manufacturing issues and the insulation requirements to prevent energizing the liquid cooling.

In an example embodiment, the IHS 200 may include a ventilation channel device, which is implemented proximate to the power connector 203 and within the chassis housing the IHS 200. The ventilation channel device, which is discussed in more detail with respect to FIGS. 4-7, may increase airflow in the back portion of the chassis, thereby providing cooling to power cables inside the chassis, to the power connector 302, and to the busbar 103.

Figure 4:
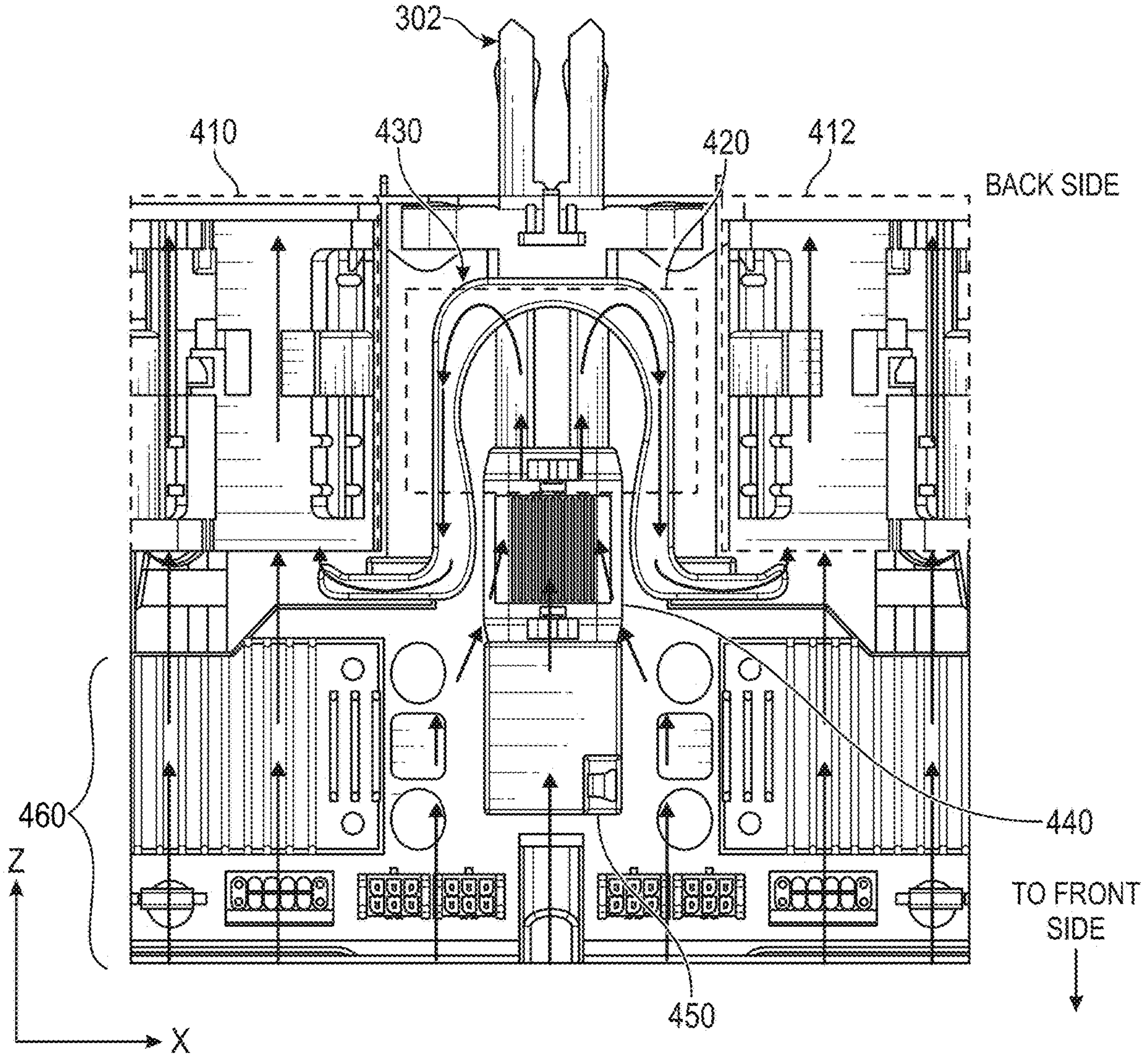
FIG. 4 illustrates a portion of the server IHS from FIGS. 2-3, according to various embodiments, including a ventilation channel device for cooling internal components of the server IHS and for cooling the busbar.
Figure 8:
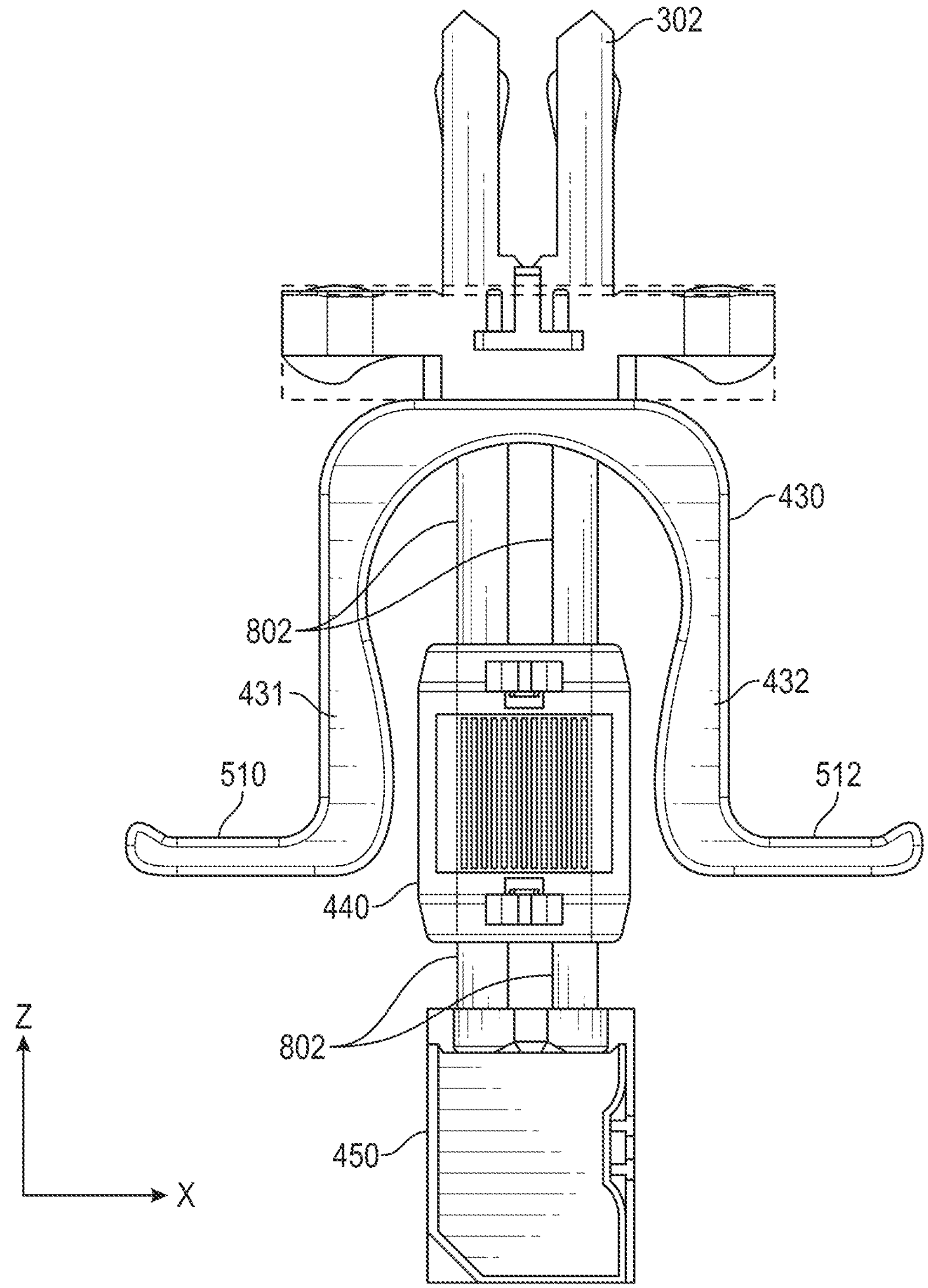
FIG. 8 illustrates a power connector, a ventilation channel device, and a heatsink, according to various embodiments.

FIG. 4 illustrates example components within the chassis of the IHS 200 and, more specifically, components within the dashed line box labeled "A" in FIG. 3. Put another way, FIG. 4 illustrates components that are disposed within the enclosure of the chassis of IHS 200. It is understood that a chassis, such as IHS 200, may include other components that are not illustrated in FIG. 4. Such components may include compute components (e.g., central processing units, graphics processing units), memory components, storage components (e.g., hard disk drives, solid-state disk drives, redundant arrays of independent disks), and the like. Power portion 460 is illustrated in front of the fans 410, 412. The power portion 460 receives power through the power connector 302 and through power cables 802 (FIG. 8). The power cables are mechanically anchored to the chassis using anchor component 450. Although not illustrated in detail, power portion 460 may distribute DC power throughout the chassis to the various components. And although not illustrated herein, the compute components, memory components, storage components and the like may be disposed in front of the power portion 460. Nevertheless, the scope of implementations is not limited to any chassis layout.

The power connector 302 is positioned at the back side of the chassis, and it extends outward. The fans 410, 412 are also positioned at the back end of the chassis. More specifically, the fans 410, 412 are positioned so that they exhaust air out the back side of the chassis.

Although fans 410, 412 are illustrated here, it is understood that various embodiments may implement any appropriate air mover, with fans being one example. A fan may include, e.g., a rotating arrangement of vanes or blades which act on the air. In other embodiments, an air mover may include a blower (e.g., a centrifugal fan that employs rotating impellers to accelerate air received at its intake and change the direction of the airflow). In these and other embodiments, rotating and other moving components of a system air mover may be driven by a motor. The rotational speed of the motor may be controlled by an air mover control signal communicated from a thermal control system (not shown). In operation, a system air mover may cool information handling resources of IHS 200 by drawing cool air into the chassis enclosure from outside the chassis, exhaust warm air from inside chassis to the outside of chassis, and/or move air across one or more heatsinks (e.g., heatsink 440) internal to chassis to cool one or more components.

The fans 410, 412, and the power connector 302 define, at least partly, a volume 420 within the enclosure of the chassis. Ventilation channel device 430 moves air from volume 420 to the intakes of the fans 410, 412. Airflow is shown using arrows, and the arrows generally follow the Z-axis (corresponding to direction 204 of FIG. 2). Within the ventilation channel device 430, the airflow enters inlets and follows hollow air channels 431, 432 (FIG. 5) toward outlets 510, 512 (FIG. 5) of the ventilation channel device 430. As a result, the air within volume 420 does not stagnate; rather, the air within volume 420 is regularly moved along with the other airflow illustrated in FIG. 4.

Figure 5:
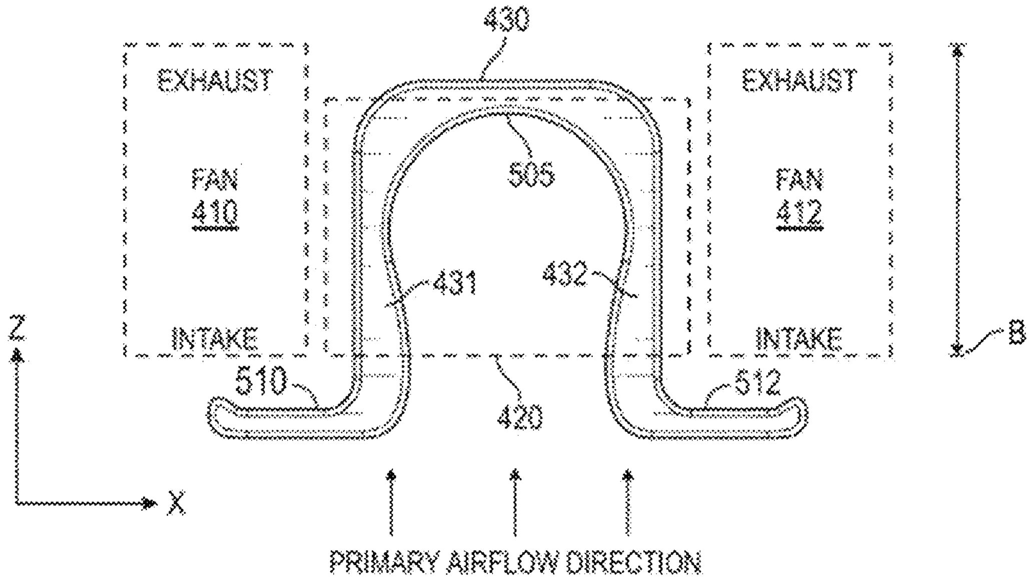
FIG. 5 illustrates a simplified view of the ventilation channel device of FIG. 4 as well as airflow direction and relative placement with respect to air movers, according to various embodiments.

FIG. 5 illustrates a simplified view of ventilation channel device 430 and its relationship to fans 410, 412. Ventilation channel device 430 includes an inlet area 505, in which air enters the hollow channels 431, 432 of ventilation channel device 430. Outlets 510, 512 are positioned at the intakes of fans 410, 412 respectively. The air travels from the inlet area 505, through the hollow air channels 431, 432, and out of the outlets 510, 512. The fan intakes cause a low-pressure volume, which drives the airflow through the ventilation channel device 430 in this example.

The fans 410, 412 are disposed on either side of the ventilation channel device 430 in the X-axis. In the present example, the ventilation channel device 430 generally has a U-shape, with the intakes 510, 512 extending laterally away from the U-shape, and the intake area 505 being at the bottom of the U shape. The U-shaped is oriented so that the bottom of the U is toward the back side of the chassis, and the outlets 510, 512 are in front of the fan intakes.

The fans 410, 412 are configured to create airflow as shown using arrows in FIG. 5, along the Z-axis. The fans are disposed in the enclosure of the chassis along the back side, with their respective exhausts being disposed at the back side of the chassis, and the fan intakes being disposed further in front along the Z-axis. In this example, the fan intakes are positioned at a point B along a length of the Z-axis. The inlet area 505 of the ventilation channel device 430 is placed between the point B and the back side of the chassis. In other words, the ventilation channel device 430 facilitates the movement of air from volume 420, via inlet area 505, which is placed in back of the fan intakes. The ventilation channel device 430 facilitates that movement of air to the outlets 510, 512, which are placed in front of the fan intakes.

Figure 6:
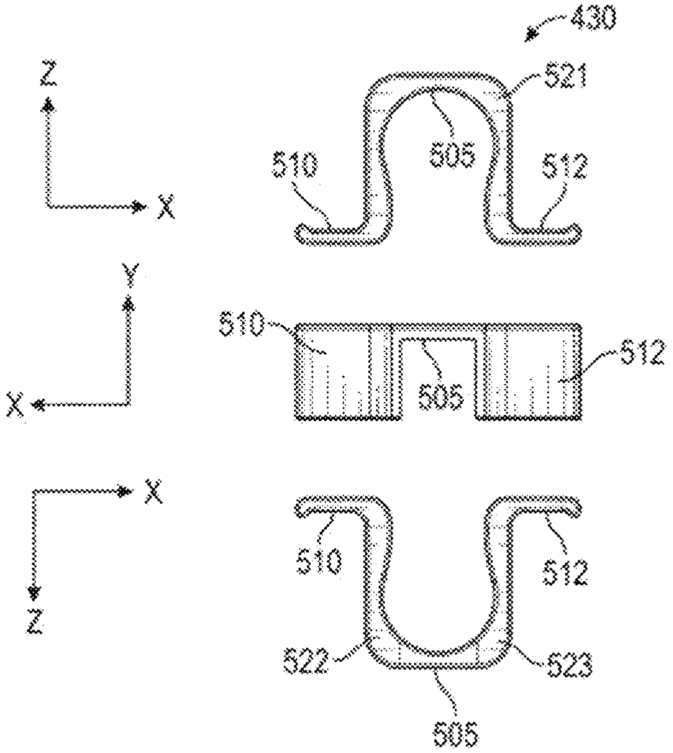
FIG. 6 illustrates different views of the ventilation channel device of FIGS. 4-5, according to various embodiments.
Figure 7:
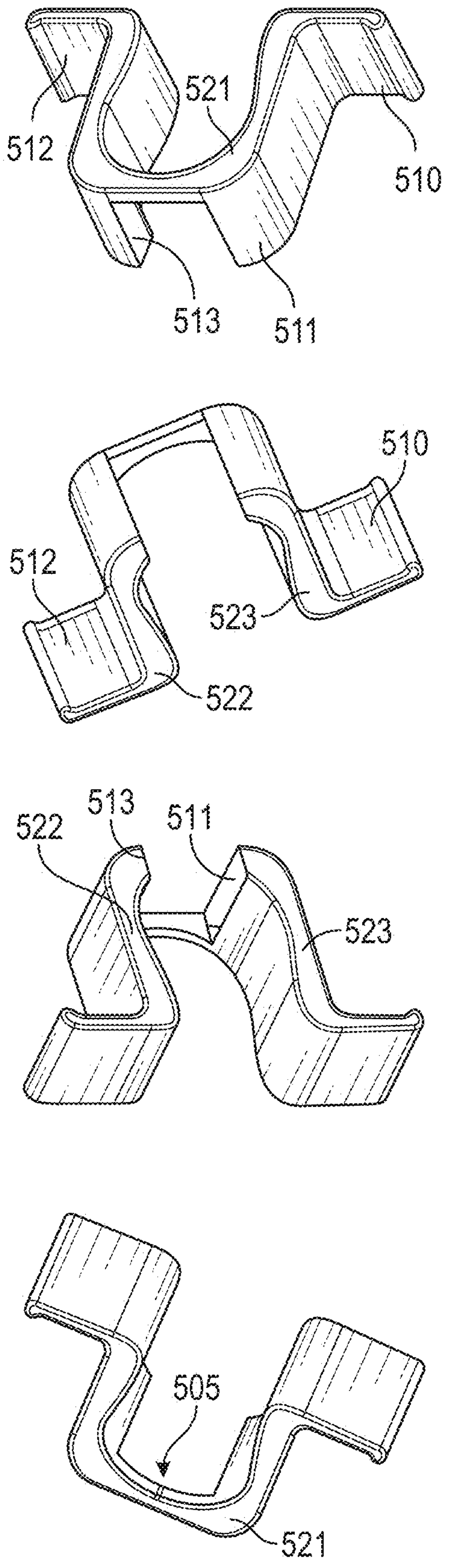
FIG. 7 illustrates different views of the ventilation channel device of FIGS. 4-5, according to various embodiments.

FIGS. 6-7 illustrate different perspective views of the example ventilation channel device 430. The middle view in FIG. 6 is a view looking along the Z-axis, and it shows that the inlet area 505 forms a rectangular aperture. The aperture in the inlet area 505 is shaped to allow power cables 802 (FIG. 8) to traverse the Z-axis length through the U-shape of the ventilation channel device 430.

Furthermore, the inlet area 505 includes two individual inlets 511, 513. Inlet 511 corresponds to outlet 510, and inlet 513 corresponds to outlet 512. Specifically, inlet 511 is in communication with outlet 510 via hollow air channel 431, and inlet 513 is in communication with outlet 512 via hollow air channel 432. Hollow air channel 431 is formed in part by top surface 521 and bottom surface 522, and hollow air channel 432 is formed in part by top surface 521 and bottom surface 523. Ventilation channel device 430, in this example, is symmetric about a centerline drawn along the Z-axis.

Ventilation channel device 430 may be constructed using any appropriate material. For instance, ventilation channel device 430 may be manufactured using 3D printing of plastic or other material, molded plastic or rubber, metal, ceramic, or the like.

FIG. 8 is an illustration of some of the components of FIG. 4, according to various embodiments. FIG. 8 provides a top-down view in the Z-X plane and omits illustrating some components for ease of illustration.

Power connector 302 is disposed at the back side of the chassis. The prongs extend rearward from the back side of the chassis, as illustrated in FIG. 3. Power connector 302 is in electrical communication with the power cables 802. Although two power cables 802 are shown, it is understood that any appropriate number of power cables 802 may be used in various embodiments. Power cables 802 run from power connector 302 along the Z-axis to the anchor device 450. Power cables 802 are routed to run through the aperture created by inlet area 505 (FIG. 6) of ventilation device 430.

Ventilation channel device 430 is disposed so that it is proximate power connector 302. In the example of FIG. 8, ventilation channel device 430 abuts power connector 302 and, in fact, is shown physically touching power connector 302. However, the scope of implementations is not limited to ventilation channel device 430 physically touching power connector 302.

As noted above, the primary direction of airflow is along the Z-axis, and it is generally expected that the power connector 302 and the power cables 802 generate heat due to carrying electric current. The ventilation channel device 430 channels air from around power cables 802 and delivers that air to the intakes of fans 410, 412 (FIG. 4). As a result, with sufficient airflow, ventilation channel device 430 may allow for convective cooling of power cables 802. As power cables 802 experience cooling, power cables 802 act as a heatsink for power connector 302 and busbar 103. Additionally, some of the airflow, as it enters inlets 511 and 513, flows against the material of the power connector 302 and carries heat from the power connector 302, through the hollow channels 431, 432, and to the intakes of the fans 410, 412.

Further, as noted above, power connector 302 may be configured for a blind connection to busbar 103. Some embodiments allow some amount of movement of power connector 302 and power cables 802 in the X-axis direction and Y-axis direction. Such movement may generally be expected to facilitate a connection in which the prongs of the power connector 302 may not be aligned exactly with the physical structure of the busbar 103 before connection. Accordingly, some embodiments may configure ventilation channel device 430 to be resilient to movement. For instance, some embodiments may implement ventilation channel device 430 using a resilient material able to withstand mechanical shaking or minor impacts, where examples of resilient material may include plastic, metal, rubber, or the like. Also, ventilation channel device 430 may be fit relatively tightly against power connector 302 and/or against the sides of fans 410, 412. Accordingly, some embodiments may implement ventilation channel device 430 using a material that has some amount of flexibility to withstand movement of power connector 302 and power cables 802.

FIG. 8 further illustrates heatsink 440, which may be applied to power cables 802 and may even be disposed partially or wholly within the U-shape of ventilation channel device 430. Like the aperture of ventilation channel device 430, the heatsink 440 also facilitates the power cables 802 running therethrough. Heatsink 802 in this example further acts to remove heat from power cables 802, thereby providing cooling as well to power connector 302 and busbar 103. The top surface of heatsink 440 includes fins (shown in FIG. 9) that are exposed to air movement, and that air movement may provide a cooling effect. Airflow over the heatsink 440 is illustrated in FIG. 4.

Figure 9:
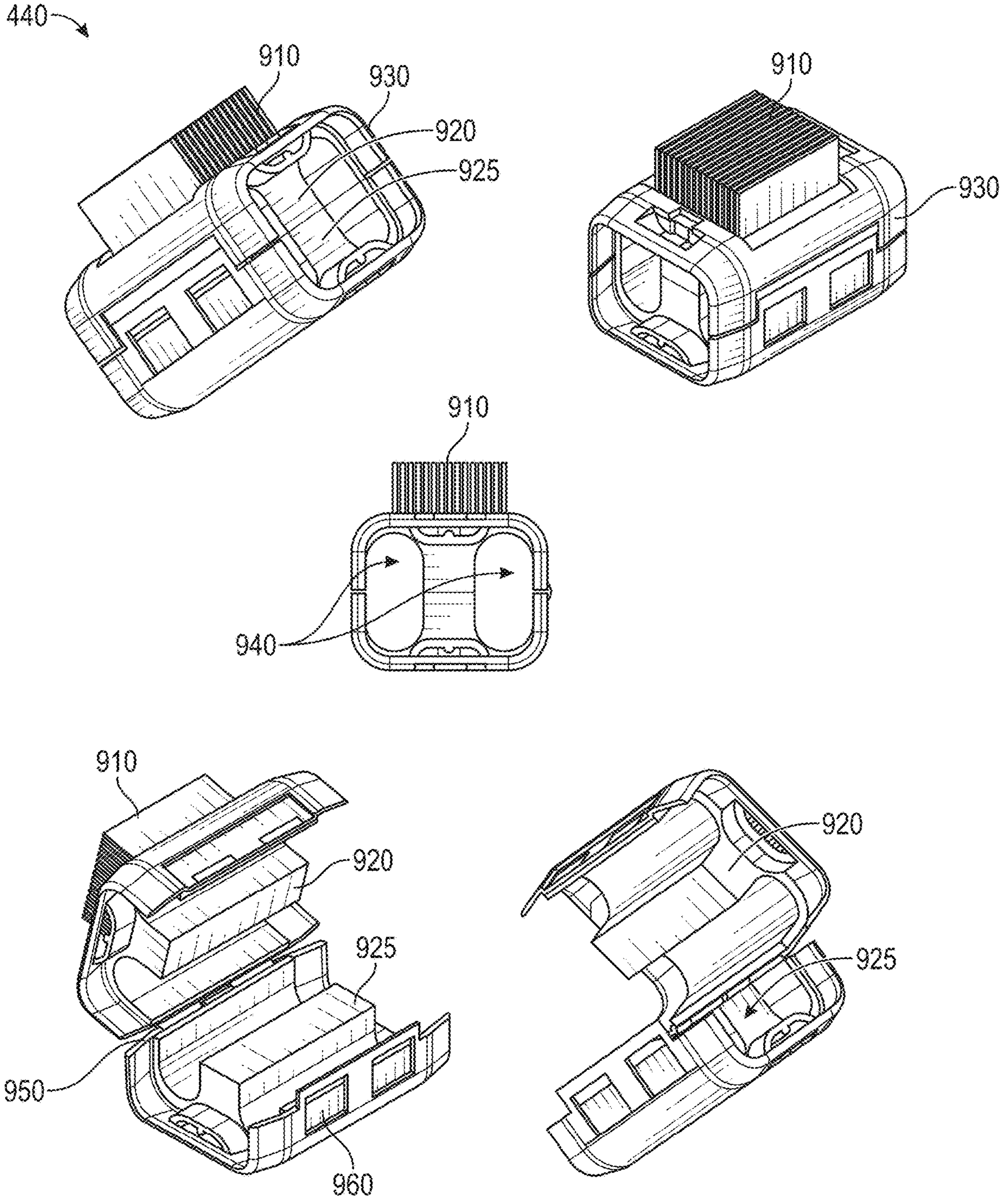
FIG. 9 illustrates various perspective views of the heatsink of FIG. 8.

FIG. 9 illustrates various perspective views of heatsink 440. Heatsink 440 includes a housing 930, a top portion 920, and a bottom portion 925. The fins 910 are included on the top portion 910, and they extend through the housing 930 and a top side of the heatsink 440. The fins 910 are exposed to airflow, when the heatsink 440 is implemented as illustrated in FIGS. 4 and 8.

The housing 930 may be constructed of any appropriate material, such as plastic or metal. The upper portion 920 and lower portion 925 may be constructed of any appropriate heat conducting material, such as metal. Heatsink 440 includes apertures 940, through which the power cables 820 may run. Apertures 940 extend along the Z-axis, as the power cables 820 run along the Z-axis.

The housing 930 may include a hinge 950, which allows the housing to open in a clamshell-like manner. Similarly, the upper portion 920 and lower portion 925 may separate and facilitate the clamshell-like opening. Housing 930 may further include clip mechanism 960 to facilitate a secure closed fit during deployment.

Upper portion 920 and lower portion 925 may be configured so that, when the heatsink 440 is closed and deployed, upper portion 920 and lower portion 925 are in physical contact and thermally conduct with each other. Therefore, heat at lower portion 925 may travel through upper portion 920 and to fins 910.

One aspect of note is that heatsink 440 is an in-line heatsink, installed around power cables 820. Heatsink 440 may be installed, removed, re-installed by closing, opening, and re-closing the hinge 950 and the clip mechanism 960. In one example, the power cables 820 are electrically insulated, whereas the material of upper portion 920 and lower portion 925 may be electrically conductive. Heatsink 440 may remove heat from power cables 820 through conduction, and that heat may be removed through fins 910 via convection.

An advantage of some embodiments is that heatsink 440 may be installed in a way that is space efficient, accommodating other components, such as ventilation channel device 430 and anchor device 450. Heatsink 440 may remove heat from power cables 802, thereby reducing thermal wear on other components of IHS 200.

Figure 10:
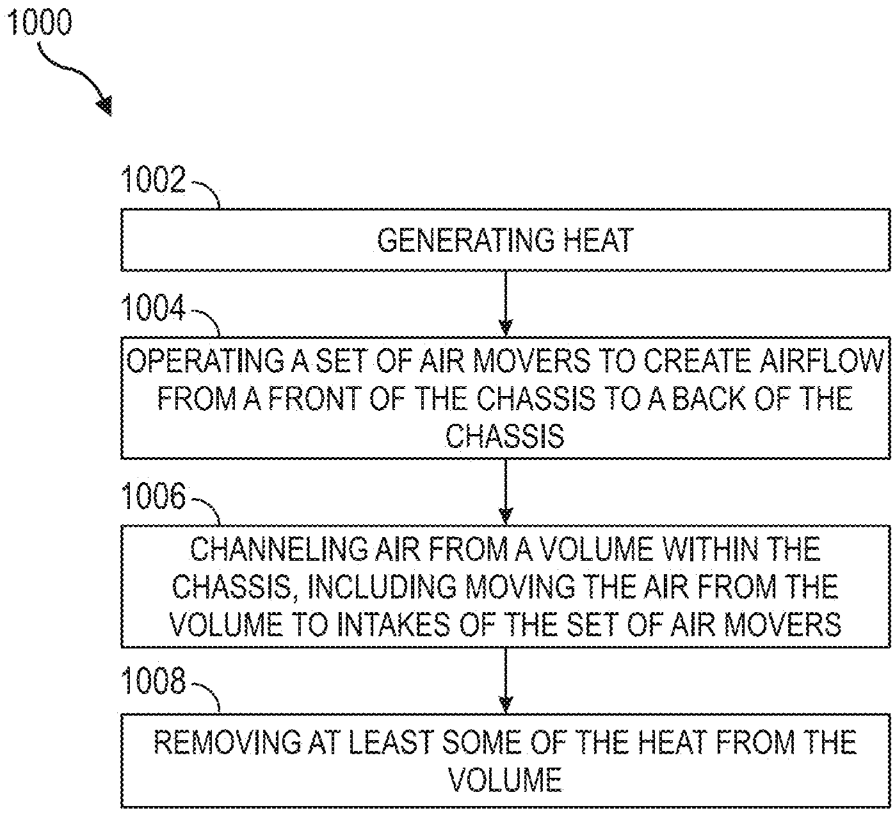
FIG. 10 illustrates an example method for cooling a computing system, according to various embodiments.

FIG. 10 illustrates a flowchart of example method 1000, for providing cooling to a computing device, according to various embodiments. Method 1000 may be performed by the components in a chassis, such as the components shown in FIGS. 4-9.

Action 1002 includes generating heat in a chassis that is plugged into a busbar of a computing rack. The chassis may include an IHS, such as IHS 200, which is plugged into a busbar 103 by power connector 302. Generating heat may include, e.g., conducting current through the power connector and through other connectors, such as power cables and the like. Conducting current may generally be expected to generate heat due to resistance in the conductors. Furthermore, other components, such as storage components and compute components, may generate heat in the chassis.

Action 1004 includes operating a set of air movers to create airflow from a front of the chassis to a back of the chassis. Furthermore, the back side of the chassis may include a power connector that is plugged into the busbar, and the set of air movers may also be located at the back side of the chassis. In the examples of FIGS. 4-5, the air movers exhaust the air out the back side of the chassis, and the intakes of the air movers are further toward the front side of the chassis. The airflow goes from the intakes of the air movers, through the air movers, and through the air mover exhausts at the back side of the chassis.

Action 1004 may include operating according to a heat management algorithm. For instance, a processing device within the chassis may control the air movers to turn on at certain times or turn off at certain times. In another example, the air movers may be always on. The scope of implementations is not limited to any particular heat management algorithm.

Action 1006 may include channeling air from a volume within the chassis. For instance, the volume may be located between a first air mover and a second air mover. An example is shown in FIGS. 4-5, where volume 402 is at least partially defined by the sides of fans 410, 412 and the power connector 302. The volume is, along the Z-axis, closer to the back side of the chassis than are the intakes of the fans 410, 412.

Action 1006 may be performed using the ventilation channel device 430. Action 1006 may include moving the air from the volume to the intakes of the set of air movers. In the example of FIGS. 4-5, the air in volume 420 is exposed to the inlets 511, 513 in inlet area 505, and the air from volume 420 travels from the inlets to the outlets 510, 512 and to the intakes of the fans 410, 412. As the airflow continues, the air within volume 420 is replaced, thereby reducing or eliminating stagnant air within the volume 420.

Action 1008 includes removing at least some of the heat from the volume. As a result of removing the heat, there may be a cooling effect of various components, such as the power connector, power cables, the busbar, and other components.

The scope of implementations is not limited to the particular series of actions shown in FIG. 10. Rather, other embodiments may add, omit, rearrange, or modify the actions. In one example, heat may be removed by a heatsink, such as by heatsink 440. Heatsink 440 may operate at least partially by taking advantage of the air movement created by the air movers. As the airflow goes from the front of the chassis to the back of the chassis, the airflow may come in contact with fins 910 of the heatsink 440, thereby removing heat by convection. The heatsink 440 may be used in addition to the ventilation channel device 430 or separate from the ventilation channel device 430, as appropriate.

The foregoing has outlined rather broadly the features and technical advantages of the present technology in order that the detailed description of the technology that follows may be better understood. Additional features and advantages of the technology will be described hereinafter which form the subject of the claims of the technology. It should be appreciated that the conception and specific embodiment disclosed may be readily utilized as a basis for modifying or designing other structures for carrying out the same purposes of the present technology. It should also be realized that such equivalent constructions do not depart from the technology as set forth in the appended claims. The novel features which are believed to be characteristic of the technology, both as to its organization and method of operation, together with further objects and advantages will be better understood from the following description when considered in connection with the accompanying figures. It is to be expressly understood, however, that each of the FIGS. is provided for the purpose of illustration and description only and is not intended as a definition of the limits of the present technology.

What is claimed is:

1. A system comprising:

a chassis, wherein the chassis has a first dimension, along which the chassis is configured for insertion in a computing rack, wherein the chassis has a first side and a second side perpendicular to the first dimension, the chassis including:

an air mover configured to create airflow in a direction along the first dimension, wherein the air mover is disposed in the chassis along the second side, further wherein the air mover has an exhaust disposed at the second side and an intake disposed along the first dimension at a first length from the second side;

a power connector, disposed at the second side of the chassis and extending away from the second side of the chassis along the first dimension; and a ventilation channel device having an inlet disposed between the first length and the second side and having an outlet disposed between the intake and the first side.

2. The system of claim 1, wherein the chassis comprises a compute chassis.

3. The system of claim 1, wherein the first side is a front side, and wherein the second side is a back side.

4. The system of claim 1, wherein the air mover comprises one or more fans.

5. The system of claim 1, wherein the power connector comprises prongs configured to interface with a busbar of the computing rack.

6. The system of claim 1, wherein the chassis further includes:

a set of power cables, coupled to the power connector, and extending along the first dimension from the power connector to an anchor disposed between the air mover and the first side.

7. The system of claim 6, wherein set of power cables extends through an inlet area of the ventilation channel device.

8. The system of claim 6, wherein the ventilation channel device conforms to a U-shape, wherein the inlet area of the ventilation channel device is disposed at a bottom of the U-shape, and wherein the outlet extends laterally from the U shape.

9. The system of claim 8, wherein the set of power cables extends through the inlet area of the ventilation channel device, and wherein the chassis further comprises a heatsink, disposed upon the set of power cables and at least partly within the U shape of the ventilation channel device.

10. The system of claim 1, wherein the chassis further includes:

an additional air mover, wherein the air mover is arranged on a first side of the ventilation channel device, and wherein the additional air mover is arranged on a second side of the ventilation channel device, further wherein the ventilation channel device includes an additional outlet disposed between an additional intake of the additional air mover and the first side.

11. The system of claim 10, wherein the ventilation channel device conforms to a U-shape in which the inlet is disposed between the power connector and the intakes of the air mover and the additional air mover, and wherein the outlet and the additional outlet extend laterally from the U shape.

12. The system of claim 11, wherein the ventilation channel device is hollow.

13. The system of claim 11, wherein the ventilation channel device is implemented using rubber or plastic.

14. The system of claim 11, wherein the ventilation channel device is arranged so that a bottom of the U-shape contacts the power connector.

15. A method comprising:

generating heat in a chassis that is plugged into a busbar of a computing rack;

operating a set of air movers to create airflow from a front of the chassis to a back of the chassis, wherein the back of the chassis includes a power connector that is plugged into the busbar, further wherein the set of air movers are located at the back of the chassis; and channeling air from a volume within the chassis, wherein the volume is located between a first air mover of the set of air movers and a second air mover of the set of air movers, including moving the air from the volume to intakes of the set of air movers, further wherein the volume is located between the intakes of the set of air movers and the back of the chassis, wherein moving the air from the volume to the intakes of the set of air movers comprises: causing the air to move from a first inlet and a second inlet of an air channel device, wherein the first inlet and the second inlet are disposed between the power connector and the intakes of the set of air movers, to outlets of the air channel device, and further wherein the outlets of the air channel device are disposed between the intakes and the front of the chassis.

16. The method of claim 15, further comprising:

removing at least some of the heat from the volume.

17. The method of claim 15, wherein causing the air to move from the first inlet and the second inlet of the air channel device to the outlets of the air channel device includes causing the air to move through hollow channels of the air channel device.

18. An information handling system (IHS) comprising:

a first air mover and a second air mover disposed at a first side of the IHS;

a power connector, disposed at the first side of the IHS and between the first air mover and the second air mover, further wherein the first air mover, the second air mover, and the power connector partially define a volume within the IHS;

a U-shaped ventilation channel device having a first air inlet, a second air inlet, a first air outlet, and a second air outlet, wherein the first air inlet and the second air inlet are disposed within the volume, wherein the first air outlet is disposed at a first intake of the first air mover, and wherein the second air outlet is disposed at a second air intake of the second air mover.

19. The IHS of claim 18, wherein the first side of the IHS is a back side of the IHS, wherein the power connector is configured to interface with a busbar in a back of a computing rack, and wherein a second side of the IHS is a front side of a chassis that includes the IHS.

* * * * *